United States Patent
Zhou et al.

(10) Patent No.: US 12,557,395 B2
(45) Date of Patent: Feb. 17, 2026

(54) HIGH POWER TVS WITH ENHANCED REPETITIVE SURGE PERFORMANCE

(71) Applicant: Littelfuse Semiconductor (Wuxi) Co., Ltd., Wuxi (CN)

(72) Inventors: Jifeng Zhou, Wuxi (CN); Glenda Zhang, Wuxi (CN); Chao Gao, Wuxi (CN)

(73) Assignee: Littelfuse Semiconductor (Wuxi) Co., Ltd., Wuxi (CN)

( * ) Notice: Subject to any disclaimer, the term of this patent is extended or adjusted under 35 U.S.C. 154(b) by 342 days.

(21) Appl. No.: 18/235,193

(22) Filed: Aug. 17, 2023

(65) Prior Publication Data

US 2024/0096872 A1    Mar. 21, 2024

(30) Foreign Application Priority Data

Sep. 16, 2022    (CN) .......................... 202211129285.X

(51) Int. Cl.
| | | |
|---|---|---|
| *H10D 89/60* | (2025.01) | |
| *H10D 8/00* | (2025.01) | |
| *H10D 8/01* | (2025.01) | |
| *H10D 62/10* | (2025.01) | |

(52) U.S. Cl.
CPC ............. *H10D 89/611* (2025.01); *H10D 8/00* (2025.01); *H10D 8/041* (2025.01); *H10D 62/114* (2025.01)

(58) Field of Classification Search
CPC ........ H01D 89/611; H10D 8/00; H10D 8/045; H10D 62/128; H10D 62/129; H10D 62/126; H10D 89/60
See application file for complete search history.

(56) References Cited

U.S. PATENT DOCUMENTS

2022/0123077 A1    4/2022    Cui

FOREIGN PATENT DOCUMENTS

| | | | | |
|---|---|---|---|---|
| CN | 201383498 Y | | 1/2010 | |
| CN | 106783949 A | * | 5/2017 | ............... H10D 8/00 |
| CN | 114203550 A | | 3/2022 | |
| JP | H1093113 A | | 4/1998 | |
| KR | 1020210071854 A | | 6/2021 | |
| TW | 201807802 A | | 3/2018 | |
| TW | 202121646 A | | 6/2021 | |

OTHER PUBLICATIONS

Kitagwa et al., "High-Voltage Emitter Short Diode (ESD)," Japanese Jourfnal of Applied Physics, vol. 35, No. 12A: 5998-6002 (Dec. 1, 1996).
Extended European Search Report for European Application No. 23197014.6, mailed Feb. 21, 2024, 6 pages.

* cited by examiner

*Primary Examiner* — Wasiul Haider
(74) *Attorney, Agent, or Firm* — KDW Firm PLLC

(57) ABSTRACT

A TVS device may include a substrate, comprising a polarity of a first type, a first dopant layer, disposed on a first main surface of the substrate, and comprising a polarity of a second type, wherein the first dopant layer forms a P/N junction with the substrate. The TVS device may further include a second dopant layer, disposed on a second main surface of the substrate, opposite the first main surface, the second layer comprising the polarity of the first type, and a patterned layer, disposed on the second main surface of the substrate, the patterned layer comprising the polarity of the second type, wherein the patterned layer is interspersed with the second layer.

15 Claims, 3 Drawing Sheets

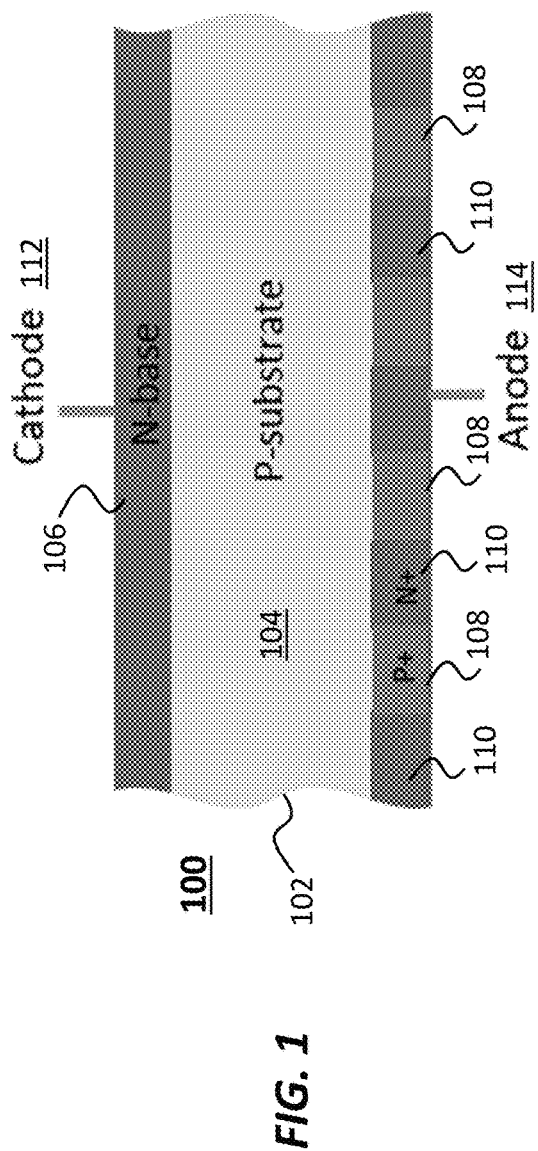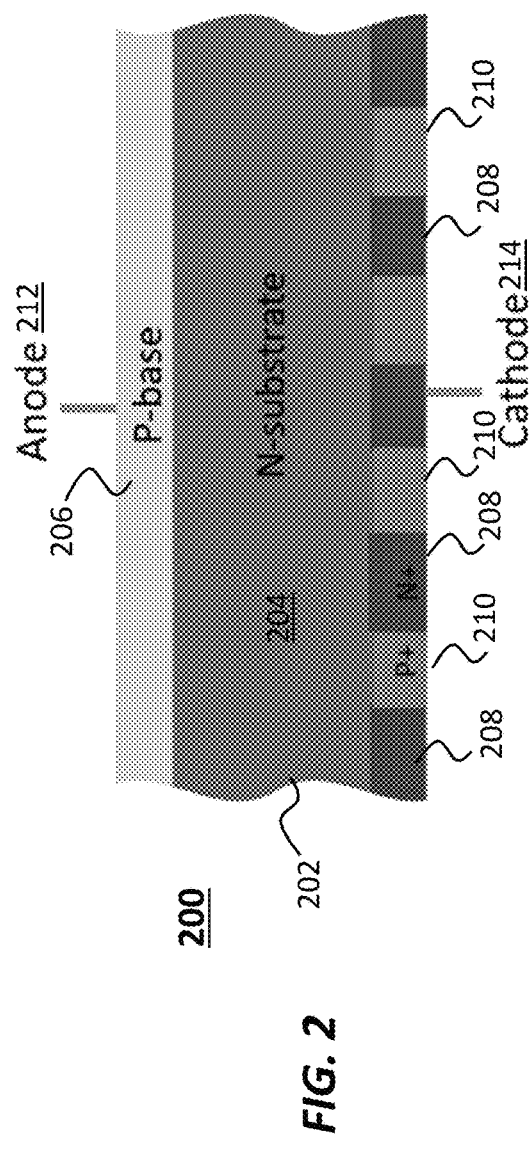
FIG. 1                    FIG. 2

HIGH POWER TVS WITH ENHANCED REPETITIVE SURGE PERFORMANCE

BACKGROUND

Field

Embodiments relate to the field of circuit protection devices, including transient voltage suppressor devices.

Discussion of Related Art

Semiconductor devices such as transient voltage suppressor (TVS) devices may be fabricated as unidirectional devices or bidirectional devices. In many applications, TVS diodes may be used to protect the sensitive circuit nodes against one-time and time-limited overvoltage faults. Such TVS diodes are also used in modern high power IGBT circuits to protect against overload in the collector circuit. In order to obtain high current density performance it is customary to use a P type or N type Si as the base material, while doping the substrate with different type impurity to form a PN junction. In this case, the surge current performance mainly depends on the PN junction size, series resistance and contact resistance. For a specific process with a given chip size, the surge current performance (IPP) is nearly fixed.

With respect to these and other considerations, the present disclosure is provided.

SUMMARY

In one embodiment, a transient voltage suppression (TVS) device is provided. The TVS device may include a substrate, comprising a polarity of a first type, a first dopant layer, disposed on a first main surface of the substrate, and comprising a polarity of a second type, wherein the first dopant layer forms a P/N junction with the substrate. The TVS device may further include a second dopant layer, disposed on a second main surface of the substrate, opposite the first main surface, the second layer comprising the polarity of the first type, and a patterned layer, disposed on the second main surface of the substrate, the patterned layer comprising the polarity of the second type, wherein the patterned layer is interspersed with the second layer.

In a further embodiment, a unidirectional transient voltage suppression (TVS) device may include a substrate, comprising a polarity of a first type. The unidirectional TVS device may also include a first dopant layer, disposed as a blanket layer on a first main surface of the substrate, the first layer comprising a polarity of a second type, wherein the first dopant layer forms a P/N junction with the substrate. The unidirectional TVS device may also include a second dopant layer, disposed on a second main surface of the substrate, opposite the first main surface, the second layer comprising the polarity of the first type. The unidirectional TVS device may also include a patterned layer, disposed on the second main surface of the substrate, the patterned layer comprising the polarity of the second type, wherein the patterned layer is interspersed as a two dimensional array of isolated islands that are surrounded by the second layer.

In another embodiment a method of forming a transient voltage suppression (TVS) device is provided. The method may include providing a substrate, comprising a polarity of a first type; forming a first dopant layer on a first main surface of the substrate, the first dopant layer comprising a polarity of a second type, wherein the first dopant layer forms a P/N junction with the substrate. The method may include forming a second dopant layer on a second main surface of the substrate, opposite the first main surface, the second layer comprising the polarity of the first type, and selectively doping the second main surface of the substrate with a dopant of the second type to form a patterned layer that is interspersed with the second layer.

BRIEF DESCRIPTION OF THE DRAWINGS

FIG. 1 illustrates one implementation of a TVS device according to embodiments of the disclosure;

FIG. 2 shows another implementation of a TVS device according to further embodiments of the disclosure;

DESCRIPTION OF EMBODIMENTS

Figure 3B:
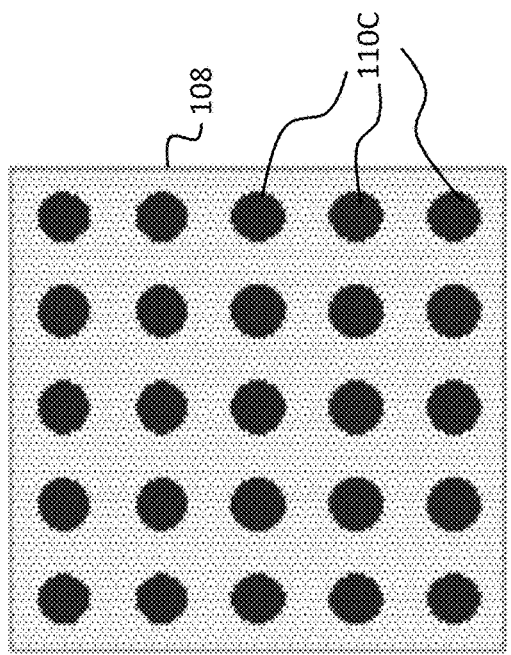
FIGS. 3A-3C show alternative configurations of a patterning layer for a TVS device, arranged according to embodiments of the disclosure.

The present embodiments will now be described more fully hereinafter with reference to the accompanying drawings, in which exemplary embodiments are shown. The embodiments are not to be construed as limited to the embodiments set forth herein. Rather, these embodiments are provided so that this disclosure will be thorough and complete, and will fully convey their scope to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate that two or more elements are in direct physical contact with one another. Also, the term "on,", "overlying," "disposed on," and "over", may mean that two or more elements are not in direct contact with one another. For example, "over" may mean that one element is above another element while not contacting one another and may have another element or elements in between the two elements.

In various embodiments, novel device structures are provided for forming a high current TVS device.

FIG. 1 illustrates one implementation of a TVS device 100. The TVS device 100 includes a substrate 102, having a first polarity type, meaning a P-type substrate or an N-type substrate. The specific illustration of FIG. 1 depicts the substrate 102 as being a P substrate. The dopant concentration of P type dopant may range between approximately $5E15\sim2E17/cm^3$ according to some embodiments of the disclosure.

The TVS device 100 may include a first dopant layer 106, disposed on a first surface of the substrate 102, in this example, the top main surface. As illustrated, the first dopant layer 106 is an N-base, having a polarity of a second type, such as N-type in the example of FIG. 1. As such, the first dopant layer 106 forms a P/N junction with the substrate 102. In various embodiments, the concentration of dopant of the first dopant layer 106 may range from approximately $1E18-1E21/cm^3$. As such, the first dopant layer 106 is coupled to a cathode 112 of the TVS device 100.

The TVS device 100 further includes a second dopant layer 108, disposed on a second main surface of the substrate 102, opposite the first main surface, meaning the lower main surface in this example. According to this embodiment, the second dopant layer 108 is formed of the polarity of the first type, in this example, a P-type dopant. In particular, the second dopant layer 108 is a P+ layer, having a dopant concentration in the range of approximately 1E18-1E20/cm³. As such, the second dopant layer 108 is coupled to an anode 114 of the TVS device 100. Moreover, the inner portion of the substrate 102 forms a third layer 104, having a P-type polarity.

Figure 3C:
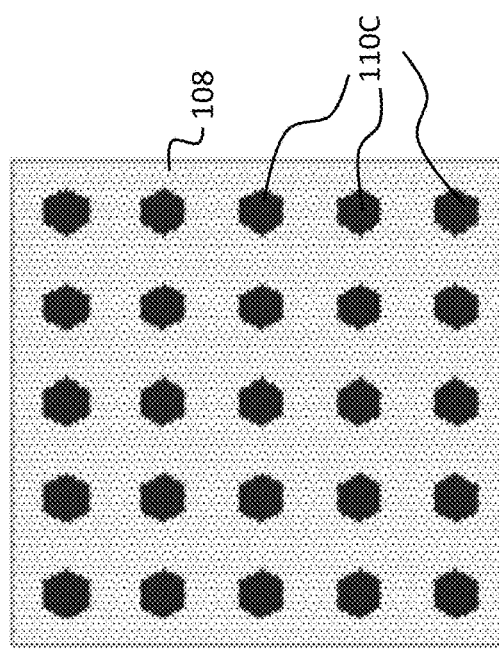
Figure 3A:
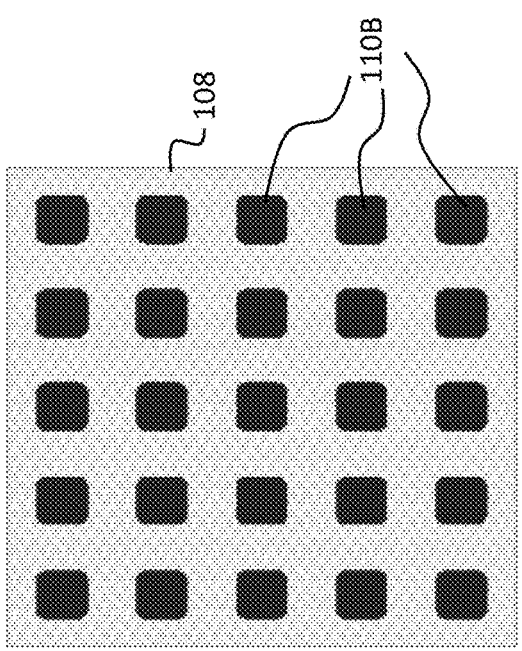

The TVS device 100 also includes a patterned layer 110, disposed on the second main surface of the substrate 102. As shown in FIG. 1, the patterned layer 110 has the polarity of the second type, meaning a N-type layer in the specific embodiment displayed. In particular, the patterned layer 110 is a N+ layer, having a dopant concentration in the range approximately of 1E18-1E21/cm³. According to embodiments of the disclosure, the patterned layer 110 is interspersed with the second dopant layer 108. FIGS. 3A-3C, discussed below, depict different configurations of a patterned layer 110, as interspersed with the second dopant layer. In various embodiments, the second dopant layer 108 and the patterned layer 110 have a thickness in a range of 5 micrometers (pa) to 50 micrometers.

Generally, the patterned layer 110 may be arranged as a plurality of regions that are isolated from one another, and surrounded by a matrix that is formed from the second dopant layer 108. As such, the TVS device 100 may be characterized as a combination of NPP+ structure and an NPN+ structure. In other words, the first dopant layer 106, third layer 104, and second dopant layer 108 form the NPP+ structure, while the first dopant layer 106, third layer 104, and patterned layer 110 form the NPN+ structure. By this configuration, the TVS device 100 is enabled to decrease the device's clamping voltage and increase a current rating. In operation, the TVS device 100 will exhibit a current-voltage waveform that doesn't change at low current levels in comparison to known devices that employ a simple NPP+ structure for a TVS device based upon a P-type substrate. Moreover, at high current density, clamping voltage decreases and surge current (IPP) can be improved accordingly.

FIG. 2 illustrates another implementation of a TVS device 200, according to further embodiments of the disclosure. The TVS device 200 includes a substrate 202, having a first polarity type, where in this case, the substrate 202 as being a N substrate. The dopant concentration of N type dopant may range between approximately 2E15~7E16/cm³ and according to some embodiments of the disclosure.

The TVS device 200 may include a first dopant layer 206, disposed on a first surface of the substrate 202, in this example, the top main surface. As illustrated, the first dopant layer 206 is an P-base, having a polarity of a second type, such as P-type in the example of FIG. 2. As such, the first dopant layer 206 forms a P/N junction with the substrate 202. In various embodiments, the concentration of dopant of the first dopant layer may range from 1E17-1E20/cm³. As shown, the first dopant layer 206 is coupled to an anode 212 of the TVS device 200.

The TVS device 200 further includes a second dopant layer 208, disposed on a second main surface of the substrate 202, opposite the first main surface, meaning the lower main surface in this example. According to this embodiment, the second dopant layer 208 is formed of the polarity of the first type, in this example, a N-type dopant. In particular, the second dopant layer 208 is a N+ layer, having a dopant concentration in the range of 1E17-1E21/cm³. As shown, the second dopant layer 208 is coupled to a cathode 214 of the TVS device 200. As such, the inner portion of the substrate 202 forms a third layer 204, having a P-type polarity.

The TVS device 200 also includes a patterned layer 210, disposed on the second main surface of the substrate 202. As shown in FIG. 2, the patterned layer 210 has the polarity of the second type, meaning a P-type layer in the specific embodiment displayed. In particular, the patterned layer 210 is a P+ layer, having a dopant concentration in the range of 1E17-1E20/cm³. Similar to the embodiment of FIG. 1, the patterned layer 210 may be interspersed with the second dopant layer 208. In various embodiments, the second dopant layer 208 and the patterned layer 210 have a thickness in a range of 5 micrometers (m) to 50 micrometers.

Generally, the patterned layer 210 may be arranged as a plurality of regions that are isolated from one another, and surrounded by a matrix that is formed from the second dopant layer 208. As such, the TVS device 200 may be characterized as a combination of a PNN+ structure and an PNP+ structure. In other words, the first dopant layer 206, third layer 204, and second dopant layer 208 form the PNN+ structure, while the first dopant layer 206, third layer 204, and patterned layer 210 form the PNP+ structure. By this configuration, the TVS device 200 is enabled to decrease the device's clamping voltage and increase a current rating. In operation, the TVS device 200 will exhibit a current-voltage waveform that doesn't change at low current levels in comparison to known devices that employ a simple PNN+ structure for a TVS device based upon a N-type substrate. Moreover, at high current density, clamping voltage decreases and surge current (IPP) can be improved accordingly.

FIGS. 3A-3C show alternative configurations of a patterning layer for a TVS device, arranged according to embodiments of the disclosure. In these figures, an embodiment of a TVS device is shown, where the second dopant layer 108 is a P+ layer, as discussed with respect to FIG. 1. Thus, in the configuration of FIG. 3A, in may be assumed that the second dopant layer 108 is formed on a second main surface of an P-substrate, where a first dopant layer formed on a first main surface is an N-layer. In FIG. 3A, a patterned layer 110B is shown as a plurality of N+ regions that exhibit a rectangular shape, which shape may be a square shape in some variants.

In FIG. 3B, a patterned layer 110C is shown as a plurality of N+ regions that exhibit an elliptical shape, which shape may include a circular shape in some variants.

In FIG. 3C, a patterned layer 110D is shown as a plurality of N+ regions that exhibit a polygonal shape (different than a rectangular shape), which shape may include a hexagonal shape in some variants.

Figure 4:
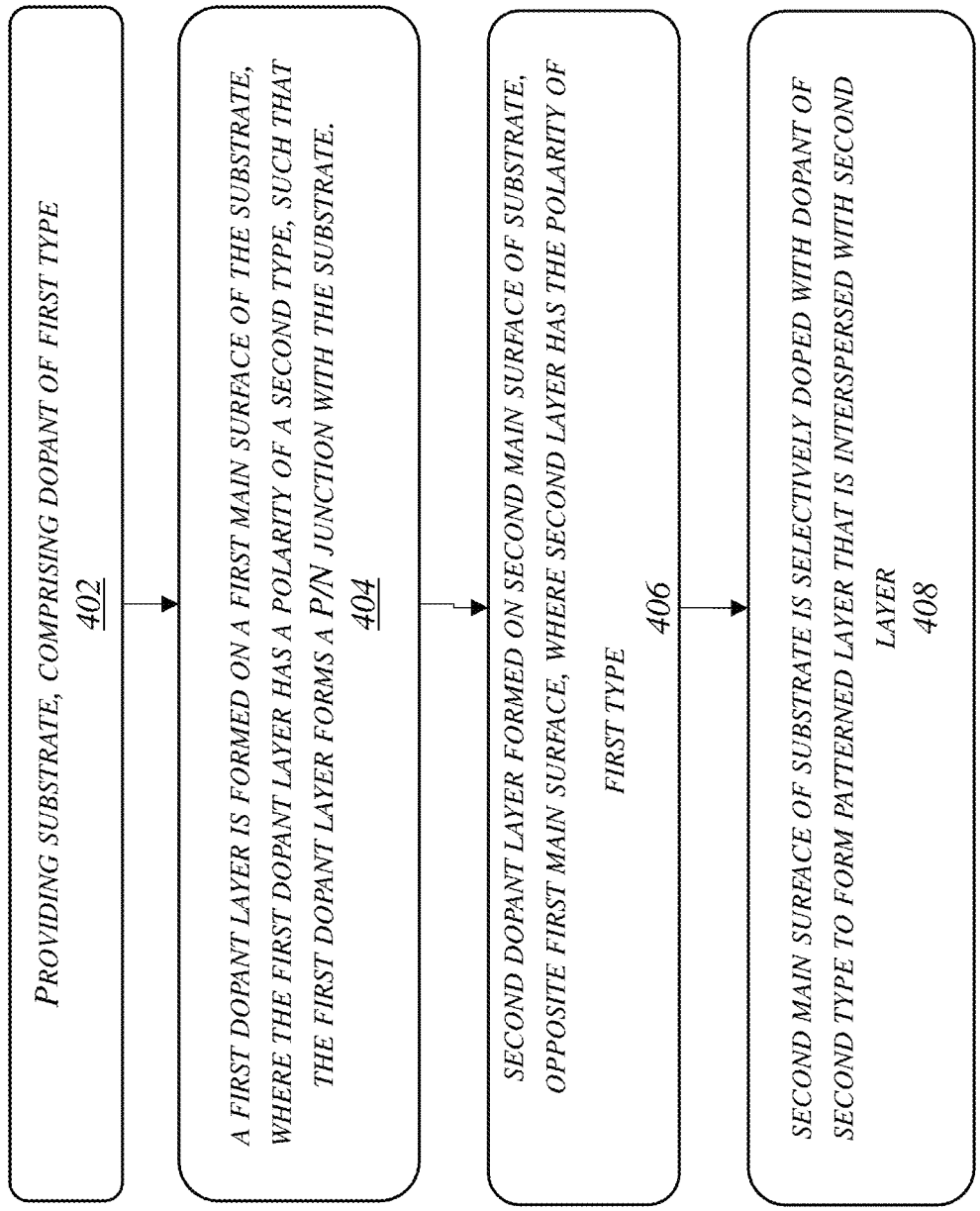
FIG. 4 presents an exemplary process flow 400.

FIG. 4 presents an exemplary process flow 400. At block 402, a substrate is provided. The substrate may be a P-substrate or an N-substrate according to different embodiments of the disclosure.

At block 404, a first dopant layer is formed on a first main surface of the substrate, where the first dopant layer has a polarity of a second type, such that the first dopant layer forms a P/N junction with the substrate. In some embodiments, the first dopant layer may be formed as a blanket layer across the first main surface.

At block 406, a second dopant layer is formed on a second main surface of the substrate, opposite the first main surface, where the second layer has the polarity of the first type, meaning the same polarity as the substrate.

At block 408, the second main surface of the substrate is selectively doped with a dopant of the second type to form a patterned layer that is interspersed with the second layer. In other words, the patterned layer forms regions on the second main surface that have the opposite polarity as the second dopant layer. In some embodiments, the patterned layer may be formed as isolated islands of the second dopant type that are surrounded by a matrix of the second dopant layer of the first dopant type. In accordance with some non-limiting embodiments, the range of size for the diameter of the isolated islands is between 5 µm-500 µm, and the range of area fraction that the islands occupy may vary from 20% to 80% based upon the particular application.

In sum, the present embodiments provide an improved unidirectional TVS device by providing a N+ patterned layer in addition to a P+ layer on the anode side of a TVS device based upon a P-substrate, or alternatively, by providing a P+ patterned layer in addition to a N+ layer on the cathode side of a TVS device based upon a N-substrate.

While the present embodiments have been disclosed with reference to certain embodiments, numerous modifications, alterations and changes to the described embodiments are possible while not departing from the sphere and scope of the present disclosure, as defined in the appended claims. Accordingly, the present embodiments are not to be limited to the described embodiments, and may have the full scope defined by the language of the following claims, and equivalents thereof.

What is claimed is:

1. A transient voltage suppression (TVS) device, comprising:
    a substrate, comprising a polarity of a first type;
    a first dopant layer, disposed on a first main surface of the substrate, the first dopant layer comprising a polarity of a second type, wherein the first dopant layer forms a P/N junction with the substrate;
    a second dopant layer, disposed on a second main surface of the substrate, opposite the first main surface, the second dopant layer comprising the polarity of the first type; and
    a patterned layer, disposed on the second main surface of the substrate, the patterned layer comprising the polarity of the second type, wherein the patterned layer comprises a plurality of isolated regions interspersed with the second dopant layer, each of the plurality of isolated regions being surrounded by a portion of the second dopant layer, thereby forming a two-dimensional array of isolated regions on the second main surface.

2. The TVS device of claim 1, the substrate comprising a P− substrate, the first dopant layer comprising an N− base, the second dopant layer comprising a P+ layer, and the patterned layer comprising a plurality of N+ regions.

3. The TVS device of claim 2, wherein the TVS device comprises a combination of an NPP+ structure and an NPN+ structure.

4. The TVS device of claim 1, the substrate comprising an N− substrate, the first dopant layer comprising an P− base, the second dopant layer comprising an N+ layer, and the patterned layer comprising a plurality of P+ regions.

5. The TVS device of claim 4, wherein the TVS device comprises a combination of an PNN+ structure and an PNP+ structure.

6. The TVS device of claim 1, wherein the patterned layer comprises a plurality of regions that are isolated from one another, and surrounded by a matrix that is formed from the second dopant layer.

7. The TVS device of claim 6, wherein the plurality of regions have a rectangular shape, an elliptical shape, or a polygonal shape.

8. The TVS device of claim 1, wherein the second dopant layer and the patterned layer have a thickness in a range of 5 micrometers to 50 micrometers.

9. A unidirectional transient voltage suppression (TVS) device, comprising:
    a substrate, comprising a polarity of a first type;
    a first dopant layer, disposed as a blanket layer on a first main surface of the substrate, the first dopant layer comprising a polarity of a second type, wherein the first dopant layer forms a P/N junction with the substrate;
    a second dopant layer, disposed on a second main surface of the substrate, opposite the first main surface, the second dopant layer comprising the polarity of the first type; and
    a patterned layer, disposed on the second main surface of the substrate, the patterned layer comprising the polarity of the second type, wherein the patterned layer comprises a plurality of isolated regions interspersed as a two-dimensional array, each of the plurality of isolated regions being surrounded by the second dopant layer, such that the first dopant layer, an interior portion of the substrate, and the second dopant layer form a first set of doped regions, and the first dopant layer, the interior portion of the substrate, and the patterned layer form a second set of doped regions on the second main surface.

10. The unidirectional TVS device of claim 9, the substrate comprising a P− substrate, the first dopant layer comprising an N− base, the second dopant layer comprising a P+ layer, and the patterned layer comprising a plurality of N+ regions.

11. The unidirectional TVS device of claim 10, comprising a combination of an NPP+ structure and an NPN+ structure.

12. The unidirectional TVS device of claim 9, the substrate comprising an N− substrate, the first dopant layer comprising an P− base, the second dopant layer comprising an N+ layer, and the patterned layer comprising a plurality of P+ regions.

13. The unidirectional TVS device of claim 12, comprising a combination of an PNN+ structure and an PNP+ structure.

14. The unidirectional TVS device of claim 9, wherein the two dimensional array of isolated islands have a rectangular shape, an elliptical shape, or a polygonal shape.

15. The unidirectional TVS device of claim 9, wherein the second dopant layer and the patterned layer have a thickness in a range of 5 micrometers to 50 micrometers.

* * * * *